(12) United States Patent
Price et al.

(10) Patent No.: US 12,159,898 B2
(45) Date of Patent: Dec. 3, 2024

(54) RESISTOR GEOMETRY

(71) Applicant: PRAGMATIC SEMICONDUCTOR LIMITED, Cambridge (GB)

(72) Inventors: Richard Price, Sedgefield (GB); Robert Mann, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 130 days.

(21) Appl. No.: 17/636,099

(22) PCT Filed: Aug. 19, 2020

(86) PCT No.: PCT/GB2020/051988
§ 371 (c)(1),
(2) Date: Feb. 17, 2022

(87) PCT Pub. No.: WO2021/032979
PCT Pub. Date: Feb. 25, 2021

(65) Prior Publication Data
US 2022/0293308 A1   Sep. 15, 2022

(30) Foreign Application Priority Data

Aug. 21, 2019 (GB) ................................ 1912025
Sep. 20, 2019 (GB) ................................ 1913610

(51) Int. Cl.
*H01C 7/00* (2006.01)
*H01C 1/01* (2006.01)
(Continued)

(52) U.S. Cl.
CPC ............. *H01L 28/24* (2013.01); *H01C 1/01* (2013.01); *H01C 1/14* (2013.01); *H01C 7/006* (2013.01);
(Continued)

(58) Field of Classification Search
CPC .... H01C 7/006; H01C 17/003; H01C 17/075; H01L 28/24; H01L 28/20; H01L 27/0629; H01L 27/13
See application file for complete search history.

(56) References Cited

U.S. PATENT DOCUMENTS 3,996,551 A   12/1976   Croson
4,609,903 A    9/1986   Toyokura et al.
(Continued)

FOREIGN PATENT DOCUMENTS

CN    1359156 A    7/2002
CN    1409400 A    4/2003
(Continued)

OTHER PUBLICATIONS

Klibanov, Lev "Integrated Resistors for an Advanced Node CMOS" EE Times; Nov. 16, 2016.
(Continued)

*Primary Examiner* — Kyung S Lee
(74) *Attorney, Agent, or Firm* — Jason H. Vick; Womble Bond Dickinson (US) LLP

(57) ABSTRACT

A thin-film resistor and a method for fabricating a thin-film resistor are provided. The thin-film resistor comprises a first terminal, a second terminal, and a resistor body providing a resistive current path between the first terminal and the second terminal, and the method comprises depositing a first layer of conductive material onto at least one of the supporting structure and the resistor body, applying a first lithographic mask to the first layer, and etching the first layer to form the first terminal; and depositing a second layer of conductive material onto at least one of the supporting structure and the resistor body, applying a second lithographic mask to the second layer, and etching the second layer to form the second terminal, wherein the first lithographic mask is different to the second lithographic mask, (Continued)

and a lateral separation of the first terminal and the second terminal is less than an in-plane minimum feature size of the first and second lithographic masks 11 Claims, 8 Drawing Sheets

(51) Int. Cl.
```
H01C 1/14      (2006.01)
H01C 17/00     (2006.01)
H01C 17/075    (2006.01)
H01C 17/28     (2006.01)
H01L 21/02     (2006.01)
H01L 21/8256   (2006.01)
H01L 27/06     (2006.01)
H01L 27/12     (2006.01)
H01L 27/13     (2006.01)
H01L 29/24     (2006.01)
H01L 29/66     (2006.01)
H01L 29/786    (2006.01)
H01L 29/872    (2006.01)
H01L 49/02     (2006.01)
```
(52) U.S. Cl.
CPC ......... *H01C 17/003* (2013.01); *H01C 17/075* (2013.01); *H01C 17/28* (2013.01); *H01L 21/02565* (2013.01); *H01L 21/8256* (2013.01); *H01L 27/0629* (2013.01); *H01L 27/0676* (2013.01); *H01L 27/1225* (2013.01); *H01L 27/1255* (2013.01); *H01L 27/127* (2013.01); *H01L 27/13* (2013.01); *H01L 28/20* (2013.01); *H01L 29/24* (2013.01); *H01L 29/66969* (2013.01); *H01L 29/7869* (2013.01); *H01L 29/78696* (2013.01); *H01L 29/872* (2013.01)

(56) References Cited

U.S. PATENT DOCUMENTS

| | | | |
|---|---|---|---|
| 5,466,484 A * | 11/1995 | Spraggins | G01K 7/22 257/E27.047 |
| 5,489,547 A | 2/1996 | Erdeljac et al. | |
| 5,872,381 A | 2/1999 | Kato et al. | |
| 5,930,638 A | 7/1999 | Reedy et al. | |
| 6,403,438 B1 | 6/2002 | Santangelo | |
| 7,183,593 B2 | 2/2007 | Yeo et al. | |
| 7,633,373 B1 * | 12/2009 | Johnson | H01C 7/006 338/195 |
| 8,343,819 B2 | 1/2013 | Doris et al. | |
| 8,513,723 B2 | 8/2013 | Booth, Jr. et al. | |
| 9,406,872 B1 * | 8/2016 | Annunziata | H10N 59/00 |
| 10,204,683 B2 | 2/2019 | Price et al. | |
| 11,316,518 B2 | 4/2022 | De Oliveira | |
| 11,575,380 B2 | 2/2023 | De Oliveira | |
| 2001/0041412 A1 | 11/2001 | Takasu | |
| 2002/0084487 A1 | 7/2002 | Takasu | |
| 2002/0084492 A1 | 7/2002 | Osanai et al. | |
| 2003/0047782 A1 | 3/2003 | Hasegawa et al. | |
| 2004/0183130 A1 | 9/2004 | Hara | |
| 2005/0035409 A1 | 2/2005 | Ko et al. | |
| 2005/0074929 A1 | 4/2005 | Hasegawa et al. | |
| 2005/0181589 A1 | 8/2005 | Miyawaki | |
| 2005/0242349 A1 | 11/2005 | Lee et al. | |
| 2005/0253178 A1 | 11/2005 | Yamaguchi et al. | |
| 2006/0091793 A1 | 5/2006 | Baude et al. | |
| 2006/0145296 A1 | 7/2006 | Coolbaugh et al. | |
| 2006/0189049 A1 | 8/2006 | Afentakis et al. | |
| 2006/0249793 A1 | 11/2006 | Beach et al. | |
| 2007/0041141 A1 * | 2/2007 | Deng | H01C 7/105 361/118 |
| 2007/0046421 A1 | 3/2007 | Gogineni et al. | |
| 2008/0237800 A1 | 10/2008 | Chinthakindi et al. | |
| 2009/0090977 A1 | 4/2009 | Freeman et al. | |
| 2010/0013026 A1 | 1/2010 | Booth, Jr. et al. | |
| 2010/0079169 A1 | 4/2010 | Kim et al. | |
| 2010/0148168 A1 | 6/2010 | Lai et al. | |
| 2010/0156588 A1 | 6/2010 | Privitera | |
| 2011/0057918 A1 | 3/2011 | Kimura et al. | |
| 2011/0133177 A1 | 6/2011 | Suzawa et al. | |
| 2011/0169089 A1 | 7/2011 | Doris et al. | |
| 2011/0175152 A1 | 7/2011 | Booth, Jr. et al. | |
| 2012/0098071 A1 | 4/2012 | Aggarwal et al. | |
| 2012/0187493 A1 | 7/2012 | Doris et al. | |
| 2013/0092924 A1 | 4/2013 | Sasagawa et al. | |
| 2013/0221346 A1 | 8/2013 | Lu et al. | |
| 2013/0309808 A1 | 11/2013 | Zhang et al. | |
| 2013/0328169 A1 | 12/2013 | Choi | |
| 2014/0027702 A1 | 1/2014 | Lu et al. | |
| 2014/0306219 A1 * | 10/2014 | Yamazaki | H01L 27/1225 257/43 |
| 2015/0155313 A1 | 6/2015 | Yamazaki et al. | |
| 2015/0162396 A1 | 6/2015 | Yagi et al. | |
| 2015/0187878 A1 | 7/2015 | Yamazaki et al. | |
| 2015/0294984 A1 | 10/2015 | Cheng et al. | |
| 2015/0318340 A1 | 11/2015 | Direcker | |
| 2016/0093638 A1 | 3/2016 | Cheng et al. | |
| 2016/0123817 A1 | 5/2016 | Bennett et al. | |
| 2016/0141312 A1 | 5/2016 | Nakatani et al. | |
| 2016/0163738 A1 | 6/2016 | Sato | |
| 2016/0329392 A1 | 11/2016 | Miyake | |
| 2017/0125604 A1 | 5/2017 | Oshima | |
| 2017/0162646 A1 | 6/2017 | Lee et al. | |
| 2017/0301796 A1 | 10/2017 | Ishihara et al. | |
| 2018/0019297 A1 | 1/2018 | Dirnecker et al. | |
| 2018/0046004 A1 | 2/2018 | Yamazaki et al. | |
| 2018/0261664 A1 | 9/2018 | Direcker et al. | |
| 2018/0337288 A1 | 11/2018 | Shin | |
| 2019/0019859 A1 | 1/2019 | Daigle et al. | |
| 2019/0148361 A1 | 5/2019 | Lu et al. | |
| 2019/0221516 A1 | 7/2019 | Kande et al. | |
| 2019/0346500 A1 | 11/2019 | Ren et al. | |
| 2020/0135445 A1 | 4/2020 | Yamazaki et al. | |
| 2020/0295126 A1 | 9/2020 | Agam et al. | |
| 2021/0226629 A1 | 7/2021 | De Oliveira | |
| 2022/0216871 A1 | 7/2022 | De Oliveira | |
| 2023/0238377 A1 | 7/2023 | Price et al. | |

FOREIGN PATENT DOCUMENTS

| | | |
|---|---|---|
| CN | 1722448 A | 1/2006 |
| CN | 106463507 A | 2/2017 |
| CN | 109786365 A | 5/2019 |
| CN | 114556495 A | 5/2022 |
| CN | 114556603 A | 5/2022 |
| CN | 114600234 A | 6/2022 |
| DE | 102020000633 A1 | 9/2020 |
| EP | 1063630 A2 | 12/2000 |
| EP | 2202802 A1 | 6/2010 |
| EP | 3236503 A1 | 10/2017 |
| EP | 2979302 B1 | 12/2020 |
| GB | 727505 A | 4/1955 |
| GB | 2490752 A | 11/2012 |
| GB | 2525184 A | 10/2015 |
| GB | 2561004 A | 10/2018 |
| GB | 2570569 A | 7/2019 |
| GB | 2586520 A | 2/2021 |
| GB | 2586522 A | 2/2021 |
| GB | 2587793 A | 4/2021 |
| GB | 2589937 A | 6/2021 |
| GB | 2598074 A | 2/2022 |
| GB | 2602408 A | 6/2022 |
| GB | 2610886 A | 3/2023 |
| JP | S 60-94757 A | 5/1985 |
| JP | 2003-007847 A | 1/2003 |
| JP | 2002-124641 A | 4/2004 |
| JP | 2008-124188 A | 5/2008 |
| JP | 2010-087518 A | 4/2010 |
| JP | 2010-225725 A | 10/2010 |
| JP | 2011-077106 A | 4/2011 |
| JP | 2018-006412 A | 1/2018 |

(56) References Cited

FOREIGN PATENT DOCUMENTS

| JP | 2018-137423 A | 8/2018 |
|---|---|---|
| WO | WO 89/03121 A1 | 4/1989 |
| WO | WO 93/07629 A | 4/1993 |
| WO | WO 2012/071878 A1 | 6/2012 |
| WO | WO 2015/079362 A1 | 6/2015 |
| WO | WO 2015/097597 A1 | 7/2015 |
| WO | WO 2018/004672 A1 | 1/2018 |
| WO | WO 2018/197988 A1 | 11/2018 |
| WO | WO 2019/116020 A1 | 6/2019 |
| WO | WO 2021/032977 A1 | 2/2021 |
| WO | WO 2021/032978 A1 | 2/2021 |
| WO | WO 2021/032980 A1 | 2/2021 |
| WO | WO 2021/032981 A1 | 2/2021 |

OTHER PUBLICATIONS

Wikipedia "Multiple Patterning" Available at https://en.wikipedia.org/w/index.php?title=Multiple_patterning&oldid=914700788; Sep. 8, 2019.
Examination Report Under Section 18(3) for Great Britain Application No. 2000887.6 mailed Mar. 27, 2023.
Combined Search and Examination Report Under Sections 17 and 18(3), for corresponding Great Britain Application No. 2202910.2, mailed Apr. 5, 2022.
U.S. Appl. No. 17/636,083, filed Feb. 17, 2022.
U.S. Appl. No. 17/636,090, filed Feb. 17, 2022.
U.S. Appl. No. 17/636,108, filed Feb. 17, 2022.
U.S. Appl. No. 17/636,113, filed Feb. 17, 2022.
International Preliminary Report on Patentability for International Application No. PCT/GB2020/051987, mailed Mar. 3, 2022.
International Preliminary Report on Patentability for International Application No. PCT/GB2020/051986, mailed Mar. 3, 2022.
International Preliminary Report on Patentability for International Application No. PCT/GB2020/051988, mailed Mar. 3, 2022.
International Preliminary Report on Patentability for International Application No. PCT/GB2020/051989, mailed Mar. 3, 2022.
International Preliminary Report on Patentability for International Application No. PCT/GB2020/051990, mailed Mar. 3, 2022.
U.S. Appl. No. 17/636,083, filed Feb. 17, 2022, Price et al.
U.S. Appl. No. 17/636,090, filed Feb. 17, 2022, Price et al.
U.S. Appl. No. 17/636,108, filed Feb. 17, 2022, Price.
U.S. Appl. No. 17/636,113, filed Feb. 17, 2022, Price.
Kawakita, Masatoshi et al. "Laterally Configured Resistive Switching Device Based on Transition-Metal Nano-Gap Electrode on Gd Oxide" Applied Physics Letters 108, 023101 (2016).
Mack, Chris A. "Seeing Double" IEEE Spectrum; Nov. 1, 2008.
Nayak, Pradipta K. et al. "Thin Film Complementary Metal Oxide Semiconductor (CMOS) Device Using a Single-Step Deposition of the Channel Layer" Scientific Reports; 4: 4672; Apr. 14, 2014.
International Search Report for International Application No. PCT/GB2020/051987, mailed Nov. 26, 2020.
Written Opinion for International Application No. PCT/GB2020/051987, mailed Nov. 26, 2020.
Invitation to Pay Additional Fees and, Where Applicable, Protest Fee for International Application No. PCT/GB2020/051986, mailed Nov. 5, 2020.
International Search Report for International Application No. PCT/GB2020/051986, mailed Jan. 13, 2021.
Written Opinion for International Application No. PCT/GB2020/051986, mailed Jan. 13, 2021.
International Search Report for International Application No. PCT/GB2020/051988, mailed Nov. 2, 2020.
Written Opinion for International Application No. PCT/GB2020/051988, mailed Nov. 2, 2020.
Invitation to Pay Additional Fees and, Where Applicable, Protest Fee for International Application No. PCT/GB2020/051989, mailed Nov. 25, 2020.
International Search Report for International Application No. PCT/GB2020/051989, mailed Feb. 8, 2021.
Written Opinion for International Application No. PCT/GB2020/051989, mailed Feb. 8, 2021.
Invitation to Pay Additional Fees and, Where Applicable, Protest Fee for International Application No. PCT/GB2020/051990, mailed Nov. 2, 2020.
International Search Report for International Application No. PCT/GB2020/051990, mailed Dec. 23, 2020.
Written Opinion for International Application No. PCT/GB2020/051990, mailed Dec. 23, 2020.
Combined Search and Examination Report Under Sections 17 and 18(3) for Great Britain Application No. 1912025.2, mailed Jan. 28, 2020.
Examination Report Under Section 18(3) for Great Britain Application No. 1912025.2, mailed Jan. 17, 2022.
Search Report Under Section 17(5) for Great Britain Application No. 2000887.6 mailed Jul. 22, 2020.
Search Report Under Section 17(6) for Great Britain Application No. 2000887.6 mailed Mar. 3, 2021.
Combined Search and Examination Report Under Sections 17 and 18(3) for Great Britain Application No. 1913610.0, mailed Mar. 11, 2020.
Examination Report Under Section 18(3) for Great Britain Application No. 1913610.0, mailed Sep. 10, 2021.
Combined Search and Examination Report Under Sections 17 and 18(3) for Great Britain Application No. GB 1915158.8, mailed Apr. 20, 2020.
Combined Search and Examination Report Under Sections 17 and 18(3) for Great Britain Application No. 1917079.4, mailed May 7, 2020.
Search Report Under Section 17(6) for Great Britain Application No. 1917079.4, mailed Mar. 22, 2021.
Examination Report Under Section 18(3) for Great Britain Application No. 1917079.4, mailed Aug. 25, 2021.
Combined Search and Examination Report Under Sections 17 and 18(3) for Great Britain Application No. 2117276.2, mailed Dec. 14, 2021.
Notification of First Office Action (including Translation) for corresponding Chinese Patent Application No. 202080071825.6, mailed Dec. 27, 2023.
Notification of First Office Action (Including Translation) for corresponding Chinese Patent Application No. 202080071849.1, mailed May 7, 2024.
Office Action for U.S. Appl. No. 17/636,113, mailed Jun. 20, 2024.
Office Action (Restriction Requirement) for U.S. Appl. No. 17/636,083, mailed Mar. 6, 2024.
Office Action for corresponding European Patent Application No. 20764719.9, mailed Jun. 25, 2024.
Office Action for corresponding European Patent Application No. 20764722.3, mailed Jun. 7, 2024.
Notification of Second Office Action (Including Translation) for corresponding Chinese Patent Application No. 202080071825.6, mailed Jul. 15, 2024.
Office Action for U.S. Appl. No. 17/636,083, mailed Aug. 9, 2024.
Office Action for U.S. Appl. No. 17/636,108, mailed Jul. 18, 2024.

\* cited by examiner

RESISTOR GEOMETRY

CROSS-REFERENCE TO RELATED APPLICATIONS

This application is a national stage application under 35 U.S.C. 371 of PCT Application No. PCT/GB2020/051988 having an international filing date of 19 Aug. 2020, which designated the United States, which PCT application claimed the benefit of Great Britain Application No. 1912025.2, filed 21 Aug. 2019 and Great Britain Application No. 1913610.0, filed 20 Sep. 2019, each of which are incorporated herein by reference in their entirety.

FIELD OF THE DISCLOSURE

The present disclosure relates to resistor geometries and methods for forming resistors with different geometries.

BACKGROUND OF THE DISCLOSURE

In thin-film electronics, resistors are commonly orientated laterally, such that the conductive terminals are disposed in a same plane and/or formed from a same material deposition layer, and the resistive body is disposed between the terminals. This resistor geometry is illustrated in the side-view drawing of FIG. 1, where the resistor 100 has a first conductive terminal 102 and a second conductive terminal 104 in the same plane and/or deposition layer, with a resistor body 106 formed from a resistive material (e.g. a resistive film) connecting the two conducting terminals 102 and 104. However, this geometry and related fabrication order results in limitations on the size and values of resistors that may be provided.

More specifically, referring to the plan-view drawing of FIG. 2, the resistance of the resistor body 106 that provides a current path between the terminals 102 and 104 is proportional to the path length/separation L between the terminals (i.e. the length of the resistor body/the separation of the interfaces between the terminals and the resistor body) and inversely proportional to the width W of the resistor body, presuming a uniform thickness. Therefore, to provide large resistances without occupying large areas of lateral space, high resistivity films, such as those that have a resistivity above 1MΩ/sq may be used. However, by using films with a high resistivity, there is an impact on the geometries and sizes of resistors of low and moderate values such as 20 kΩ for example.

In thin-film resistors, the minimum width W and length L of the film that forms the body of the resistor are primarily determined by the spatial resolution i.e. minimum in-plane feature size of the lithographic process used to pattern the relevant thin-film layers. For example, using a resistive film of 1MΩ/sq and minimum width of 4 µm, a 10MΩ resistor requires a separation between the terminals of 40 µm, thus resulting in a resistive film area of 160 µm². However, whilst this resistive film area is practicable, problems may arise when considering resistors of smaller values. For example, when aiming to provide a 20 kΩ resistor using a same 1MΩ/sq resistive film with a same width of 4 µm, a terminal separation of 80 nm will be required, which is beyond the resolution of many lithographical processes, such as conventional thin-film optical lithography for example. Alternatively, if the terminal separation is increased to the minimum resolution of the lithography technique being used e.g. 0.5 µm, a resistive film width of 25 µm will be required, resulting in a resistive film area of 12.5 µm². Consequently, although the value of a 20 kΩ thin-film resistor is 3 orders or magnitude lower than a 10MΩ thin-film resistor, the lateral space i.e. area occupied by the 20 kΩ resistor is only one order of magnitude less than the 10MΩ resistor.

Thin-film electronics may be used in flexible IC (FlexIC) architectures; however, the above-mentioned limitations of the size of resistors may act to prevent further miniaturisation of FlexIC architectures, for example, when loads are required for thin-film transistors to form inverters. Although in some circumstances inverters may be provided via diode- or transistor-load transistors, these often suffer from high power consumption and slow switching speeds given the unipolar nature of FlexIC semiconductors, and thus may be a sub-optimal solution in a number of scenarios.

Conventional lateral thin-film resistor geometries also enforce limitations on the placement and utilisation of resistors in thin-film electronics since they have less flexibility in how they may be placed and fabricated in thin-film and FlexIC architectures.

Therefore, it would be desirable if thin-film resistor geometries and methods for forming thin-film resistors can be provided that overcome the above-mentioned limitations in terms of lithographical resolution, lateral space requirements, and geometry flexibility.

BRIEF SUMMARY OF THE DISCLOSURE

It is an aim of certain examples of the present disclosure to provide a thin-film resistor and methods of fabricating thin-film resistors that have a terminal separation less than the minimum in-plane feature size of the lithographic tool used to pattern the layers of the thin-film resistor. By achieving a terminal separation that is less than the minimum in-plane feature size, thin-film resistors with reduced lateral dimensions may be achieved at a lower cost, and improved scaling between resistor value and lateral dimensions can also be achieved.

According to a first aspect of the present disclosure there is provided a method for fabricating a thin-film resistor on a supporting structure, the thin-film resistor comprising a first terminal, a second terminal, and a resistor body providing a resistive current path between the first terminal and the second terminal, the method comprising depositing a first layer of conductive material onto at least one of the supporting structure and the resistor body, applying a first lithographic mask to the first layer, and etching the first layer to form the first terminal; and depositing a second layer of conductive material onto at least one of the supporting structure and the resistor body, applying a second lithographic mask to the second layer, and etching the second layer to form the second terminal, wherein the first lithographic mask is different to the second lithographic mask, and a lateral separation of the first terminal and the second terminal is less than an in-plane minimum feature size of the first and second lithographic masks.

In one example, the lithographic masks are optical lithographic masks.

In another example, at least a portion of the second terminal lies outside of a lateral plane defined by the vertical extent of the first terminal.

In another example, the resistor body is non-planar.

In another example, the resistor body includes a first planar region lying in a first lateral plane and a second planar region lying in a second lateral plane, and a third planar region lying in a third plane substantially perpendicular to the first and second lateral planes and connecting the first and second planar regions, and wherein the first and second lateral planes are separated by a distance in a direction parallel to the third plane.

In another example, the first planar region of the resistor body laterally overlaps at least part of the first terminal.

In another example, the second planar region of the resistor body laterally overlaps at least part of the second terminal.

In another example, the second terminal lies wholly outside of the lateral plane defined by a vertical extent of the first terminal.

In another example, the resistor comprises a third terminal electrically connected to the first terminal, and wherein the resistor body provides a resistive path between the second terminal and the third terminal which is different to the resistive path between the first terminal and the second terminal, and wherein the method comprises forming the third terminal at a separate time to at least one of the first terminal and the second terminal.

In another example, the separation of the second terminal and the third terminal is less than an in-plane minimum feature size of the first and second lithographic masks.

In another example, the third terminal lies at least partially outside of the lateral plane defined by a vertical extent of the first terminal and a lateral plane defined by a vertical extent of the second terminal.

In another example, a lateral separation between any two terminals is less than 500 nm.

In another example, the first terminal, the second terminal and the resistor body are formed from separate thin-film layers of material.

In another example, the first terminal and the second terminal do not vertically overlap.

In another example, applying the first and second lithographic masks each includes depositing an unstated photoresist layer onto the respective layer of conductive material, applying a photo-lithographic mask to the photoresist layer and developing the photoresist layer to produce a patterned photoresist layer.

In accordance with a second aspect of the present disclosure, there is provided a thin-film resistor comprising a first terminal formed from a first thin-film layer of conductive material, a second terminal formed from a second thin-film layer of conductive material, and a resistor body formed from a thin-film layer of resistive material providing a resistive current path between the first terminal and the second terminal, wherein a lateral separation of the first terminal and the second terminal is less than the minimum in-plane lateral feature size of the thin-film resistor.

In one example the lateral separation of the first terminal and the second terminal is at least an order of magnitude smaller than the minimum in-plane lateral feature size of the thin-film resistor.

In another example, the thin-film resistor comprises a third terminal electrically connected to the first terminal, and wherein the resistor body provides a resistive path between the second terminal and the third terminal which is different to the resistive path between the first terminal and the second terminal.

In another example, the third terminal lies at least partially outside of the lateral plane defined by the first terminal and a lateral plane defined by the second terminal.

In another example, the first terminal and the second terminal are in separate deposition layers.

In another example, a lateral separation between any two of the terminals is less than 500 nm.

In another example, the first terminal and the second terminal do not vertically overlap.

In another example, a lateral separation between any two terminals of the thin-film resistor is less than a minimum in-plane feature size of the thin-film integrated circuit.

BRIEF DESCRIPTION OF THE DRAWINGS

Embodiments of the present disclosure are further described hereinafter with reference to the accompanying drawings, in which.

DETAILED DESCRIPTION

Figure 1:
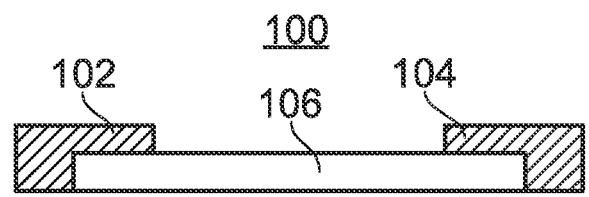
FIG. 1 provides a schematic diagram of a conventional thin-film resistor.
Figure 2:
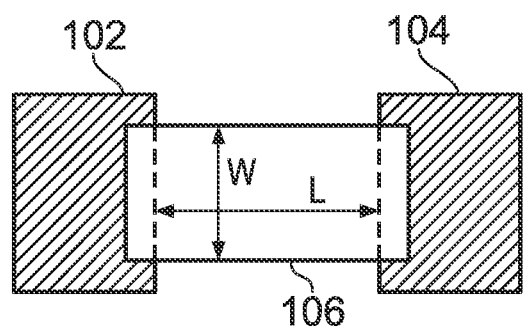
FIG. 2 provides a schematic diagram of a conventional thin-film resistor.

In accordance with the present disclosure, at least some of the limitations discussed above may be addressed by forming the conductive terminals/contacts of a thin-film resistor using two different layers i.e. the conductive material forming each of the terminals is deposited separately from the other at different points in time and/or the lithographic masks used to pattern the layers that form the terminals are applied independently. For example, the resistive film layer from which the resistor body is formed may be formed during a first deposition, lithographic patterning and etching step; a first terminal formed during a second deposition, lithographic patterning and etching step; and a second terminal formed during a third deposition, lithographic patterning and etching step. However, this order may be altered as required to achieve any desired geometry. For example, the material forming the first terminal may be deposited first, followed by the material forming the resistive film, followed by the material forming the second terminal.

Advantageously, forming the terminals via two separate deposition layers may enable the separation of the terminals (i.e. the separation between the interfaces between the terminals and the resistor body) to be smaller than the resolution of the lithography method being used i.e. the length L may be greater than zero but less than the minimum resolution of the lithographic mask/tool. In particular, instead of being limited by the in-plane resolution of the lithographic tool being used, the minimum separation may be determined by the overlay error of the lithography technique and the masks rather than its in-plane resolution. For example, with respect to optical lithography, the overlay error i.e. positioning error of two masks defining two distinct layers may be approximately 30 nm whereas the minimum in-plane optical resolution of the lithographic tool may be 500 nm. Consequently, this overlay error would be sufficient to achieve the example terminal separation of 80 nm discussed above even if an error of +/−5% is present. As well as effectively achieving increased patterning resolutions, lower cost lithographic tools may be used to achieve patterning resolutions normally associated with higher cost lithographic tools by following the presently disclosed technique.

Furthermore, in addition to enabling small terminal separations to be achieved, new resistor geometries may be formed by separating the deposition/patterning/etching steps that are used to form the terminals of a thin-film resistor. For example, by forming the terminals separately, the terminals may only partially overlap or not overlap at all in a spatial layer/planar layer/lateral plane such that the resistors no longer have a purely lateral structure.

Lastly, some of the limitations associated with conventional lateral thin-film resistor architecture may be addressed by the novel (e.g. 3D) thin-film resistor architectures set out by the present disclosure.

FIGS. 3 to 12 provide schematic illustrations of a number of different resistor geometries that may be formed either by the described two-step lithographic process (i.e. when the terminal separation is less than the minimum resolution of the lithographic tool or it is not possible to deposit the materials for the terminals in a single layer) or via conventional thin-film fabrication techniques. Consequently, although described with reference to the two-step lithographic process and their ability to achieve low resistor values in a space efficient manner, they are not only limited to the terminals being formed in this manner.

FIGS. 3a, 3b, 4, and 5 illustrate alternative thin-film resistor geometries in accordance with the present disclosure, where the resulting terminal separation may be less than the resolution of the lithographic tool used.

Figure 3A:
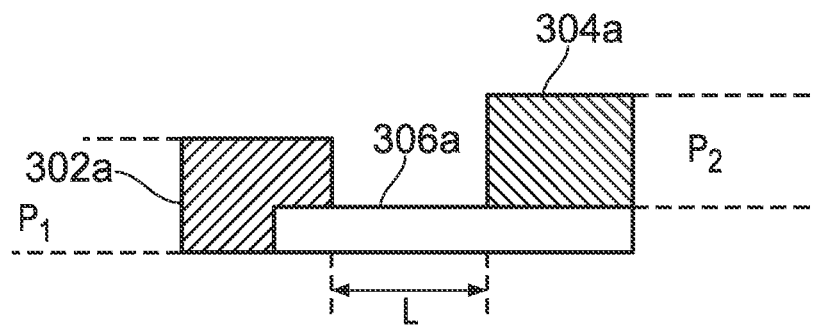
FIG. 3a provides a schematic diagram of a thin-film resistor in accordance with an example of the present disclosure.

In FIG. 3a, the lateral planes $P_1$ and $P_2$ defined by the vertical extents of terminals 302a and 304a respectively, only partially overlap, and thus the terminals no longer have a purely lateral spatial geometry. In addition, in this particular example, terminal 302a lies partially on top of resistor body 306a and partially on the surface underlying the resistor body and terminal 302a. Whilst this geometry may not be exclusively formed by separation of the deposition stages for the two terminals, by doing so decreased terminal separations may be achieved. For example, the material forming the resistor body 306a is deposited first and possibly patterned and etched. Subsequently, the material forming the first terminal 302a is deposited, lithographically patterned using a first mask, and etched to form the first terminal. Finally, the material forming the second terminal 304a is deposited, lithographically patterned using a second mask, and etched to form the second terminal. These processes are discussed in more detail with respect to FIGS. 13, 14 and 16. In other variants of this approach, terminals 302a and 304a may both be deposited wholly on top of resistor body 306a, giving them a substantially planar and lateral spatial geometry. The thicknesses of terminals 302a and 304a may be substantially the same so that their lateral planes substantially overlap. Alternatively, the thicknesses of terminals 302a and 304a may differ, so that their lateral planes partially overlap. TFT geometries and variations described above in relation to FIG. 3a may employ a different conductive material for each of the terminals so that etch processing requirements are eased. Furthermore, different etching process may be used in the formation of one or more the first terminal, second terminal, and resistor body so that, for example, the formation of the second terminal does not adversely affect the first terminal and/or different arrangements of etch-stop layers can be used.

Although FIG. 3a shows the structure of the resistor as comprising surfaces only in perpendicular horizontal and vertical planes, this is for illustrative purposes and in reality the material forming the terminal 302a may conform to the resistor body 306a when deposited and therefore may not have a purely horizontal and vertical planar structure. In other words, the thickness of the material forming the terminal 302a will be approximately the same whether it is deposited on the resistor body or the underlying substrate such that the shape of the material forming the terminal 302a will approximately conform to the shape of the surface(s) on which it is deposited.

Figure 3B:
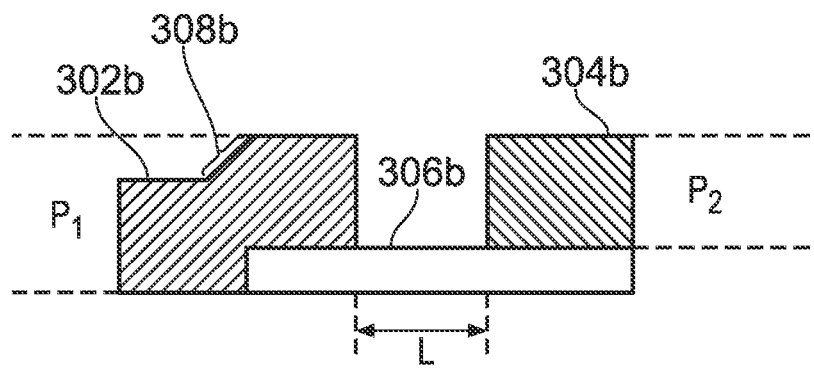
FIG. 3b provides a schematic diagram of a thin-film resistor in accordance with an example of the present disclosure.

FIG. 3b illustrates the structure of a resistor in accordance with the present disclosure where the material forming one of the terminals 302b at least partially conforms to the shape of the resistor body 306b onto which it has at least partially been deposited. More specifically, in FIG. 3b the order of deposition etc. is the same as that described with respect to FIG. 3a but the terminal 302b has non-vertical/horizontal portions such as 308b resulting from the deposition of the material forming the terminal 302b covering an edge of the resistor body 306b. Furthermore, as also illustrated in FIG. 3b, the planes $P_1$ and $P_2$ refer to the vertical extent of the terminals 302b and 304b respectively.

More generally, although the resistor structures of FIGS. 4 to 16 predominantly show idealised structures with vertical and horizontal planar structures, in each of the illustrated structures the various layers may at least partially conform to the layer onto which they are deposited in a similar manner to the terminal 302b in FIG. 3b. Furthermore, the specific shape of the conforming layers may vary depending on the material deposition technique used and thus may be straight or curved.

By following the approach to the fabrication of the resistor geometry of FIGS. 3a and 3b, it is possible to achieve a value of L that is less than the in-plane optical resolution of the lithographic tool being used, which in turn enables a wider range of resistor values with scalable sizes to be achieved in thin-film ICs. More specifically, because the first and second terminals are formed using separate lithographic masks, it is the alignment accuracy of those masks that limits the separation of the terminals as opposed to the in-plane resolution/minimum feature size of any particular lithographic mask, where the alignment accuracy is often higher than the absolute resolution of the mask. Furthermore, because each terminal is defined in a single exposure, this approach is lower in cost and complexity, and higher in throughput, than existing multiple exposure techniques for high resolution lithography, such as LELE (litho-etch-litho-etch).

Furthermore, as is explained in more detail below, the novel geometry and fabrication of the resistor of FIGS. 3a and 3b and also that of the other example resistors may be used to provide additional design/architecture flexibility when designing thin-film and/or FlexICs.

Figure 4:
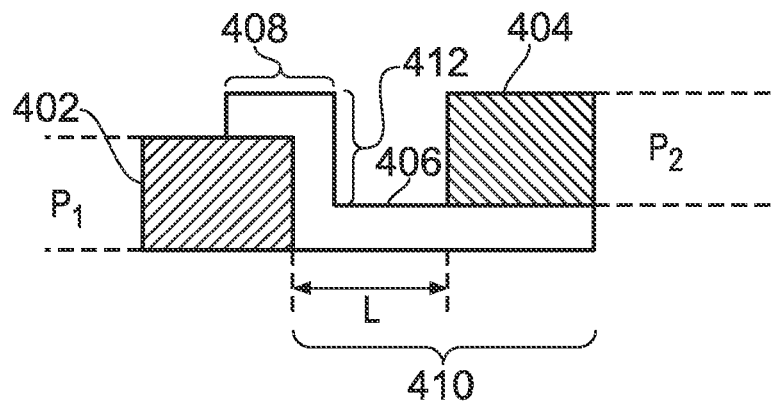
FIG. 4 provides a schematic diagram of a thin-film resistor in accordance with an example of the present disclosure.

Referring to FIG. 4, in this geometry the lateral planes defined by the vertical extents of the terminals ($P_1$ and $P_2$) partially overlap as in FIGS. 3a and 3b but the resistor includes a non-planar resistor body, which includes planar regions that lie in different planes. More specifically, the resistor body includes a first planar region 408 lying in a first lateral plane, a second planar region 410 lying in a second lateral plane, and a third planar region 412 which lies in a third (vertical) plane which is substantially perpendicular to the first and second lateral planes, such that the first and second planar regions are separated by a distance parallel to the third plane. As described in relation to FIGS. 3a and 3b, the structure in FIG. 4 represents an idealised case and in general the third plane/third planar region 412 may be oriented away from the perpendicular, depending on the patterning and etching technologies employed to generate the structure.

In terms of the fabrication of the resistor of FIG. 4, the material for first terminal 402 may be deposited in a first layer, which is then lithographically patterned and etched; followed by the material for resistor body 406 in a second layer, which is then lithographically patterned and etched; followed by the material for the second terminal 404 in a third layer, which is then lithographically patterned and etched. The resistor body 406 may be patterned to extend over as much of first terminal 402 as desired, for example over none, some or the entirety of the upper surface of first terminal 402. As for FIG. 3a, a terminal separation L which is less than the resolution of the lithographic tool may be achieved by applying separate lithographic masks for the first and second terminals.

Figure 5:
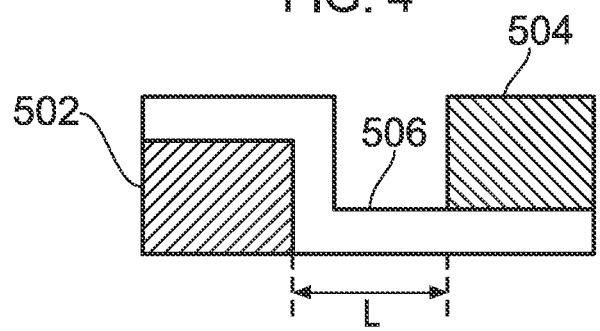
FIG. 5 provides a schematic diagram of a thin-film resistor in accordance with an example of the present disclosure.

In FIG. 5 the geometry and fabrication ordering is similar to that of the resistor of FIG. 4; however, the fabrication process may be simplified because only the layer forming the resistor body 506 may be required to act as an etch-stop since it may cover all of the upper surfaces of the first terminal 502, thus preventing etching of the first terminal when the second terminal is being etched.

Figure 6:
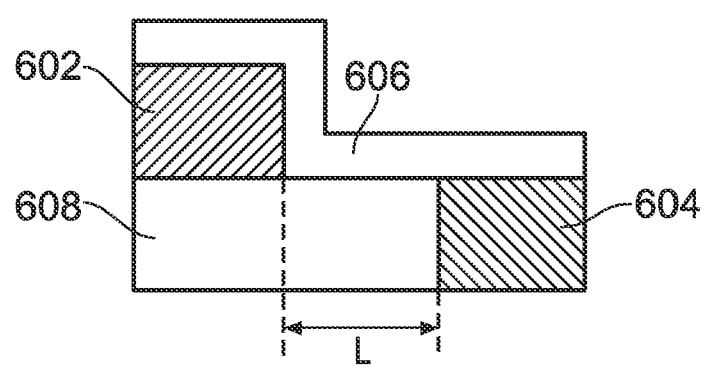
FIG. 6 provides a schematic diagram of a thin-film resistor in accordance with an example of the present disclosure.

In FIG. 6, the first terminal 602 and the second terminal 604 are deposited, patterned and etched in separate layers around an additional supporting or substrate layer 608 to achieve a separation of L, where L may be less than the resolution of the lithography mask. Subsequently, the resistive film layer that forms the resistor body 606 is deposited. With respect to the etching required to achieve the geometry of FIG. 6, the layer forming the terminal 602 may be patterned and etched down onto the second terminal 604 and the additional layer 608. In some examples the second terminal 604 and the resistive film may be etch-stops in order to simplify the fabrication process. The additional layer 608 may be omitted, for example by choosing different materials and/or different etch processes for first and second terminals 602 and 604. In this case the first and second terminals are deposited, patterned and etched in separate layers, with the structure of the first-deposited terminal being substantially unaffected by the etching process of the second-deposited terminal. The resistor body is deposited on top of the first and second terminals.

Alternatively, if the separation L is not required to be less than the resolution of the lithographic tool/mask being used, the first and second terminals may be deposited, patterned and etched together.

With respect to the scaling of the lateral space required for lower value thin-film resistors compared to high value thin-film resistors when a high resistivity resistive film is used, by enabling terminal separations that are smaller than a lithographic resolution, via the use of the geometries and fabrications orders described above, improvements in scalability may be achieved. For example, a 20 kΩ resistor formed from a resistive film having a resistivity of 1MΩ/sq, a width of 4 µm, and having a terminal separation of 80 nm, may occupy 0.32 µm$^2$ instead of 12.5 µm$^2$ thus achieving a reduction in lateral space of the same order of magnitude as the reduction in resistance from 10MΩ to 20 kΩ.

Although decreases in minimum spacing between resistor terminals may be achieved by depositing material layers, patterning and/or etching the terminals separately, the tolerance of the resulting resistor may be adversely affected by variation in the alignment between the layers and thus the terminals, especially given the small terminal separations and the high resistivity of the resistive film layer. However, this effect may be reduced by forming the desired resistor from two parallel resistors such that variations in the alignment of layers have less effect on the overall resistance.

Figure 7:
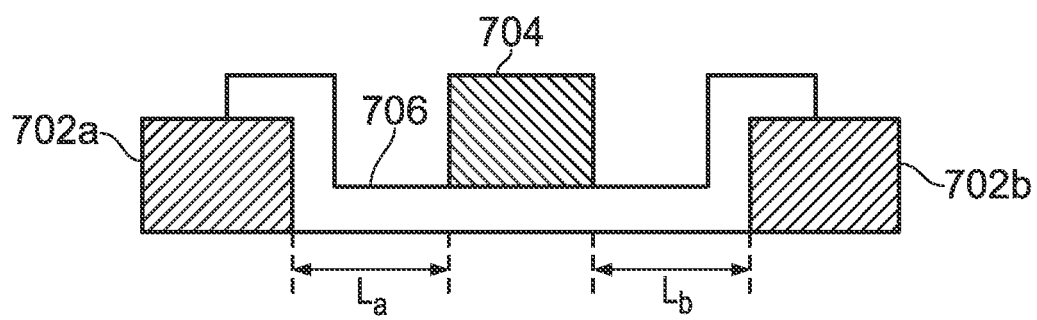
FIG. 7 provides a schematic diagram of a thin-film resistor in accordance with an example of the present disclosure.

FIG. 7 illustrates the geometry of a thin-film resistor in which at least two of the terminals have been formed in separate layers, and where the overall resistance is formed from two parallel resistors, such as that illustrated in FIG. 4, although the other resistor geometries may also be used.

In particular, in FIG. 7 the first terminals 702a and 702b are electrically connected to one another such that a first resistor $R_a$ is formed between terminals 702a and 704 separated by a distance $L_a$ of resistive film 706; and a second resistor $R_b$ is formed between terminals 702b and 704 separated by a distance $l_b$ of resistive film 706. The overall resistance R between the terminals 702a,b and 704 is then given by $R=R_aR_b/(R_a+R_b)$. Consequently, the overall resistance of the resistor is less sensitive to variation in the relative positions of the terminals, and that of the second terminal 704 relative to terminals 702a and 702b in particular.

The resistor of FIG. 7 may be fabricated in a number of different ways. For example, if the total distance between the terminals 702a and 702b, and the width of the terminal 704 is larger than the minimum resolution of the lithographic tool, these terminals may be deposited, patterned and etched together. Alternatively, if the separation between all the terminals is less than the minimum resolution of the lithographic tool, each of the terminals may be deposited, patterned and etched separately in order to make use of the relatively higher overlay accuracy of the lithographic masks. Alternatively, if the size of the resistor of FIG. 7 is not to be constrained by the minimum in-plane resolution of the lithographic tool being used, the central terminal 704 may be required to have a width smaller than the minimum in-plane resolution of the lithographic mask. In such a case, the terminal 704 may be required to be patterned in two stages so that its width is limited by the overlay error of the lithographic masks as opposed to the in-plane resolution of the masks. Consequently, the structure of FIG. 7 may require at least three separate lithographic steps.

Figure 8:
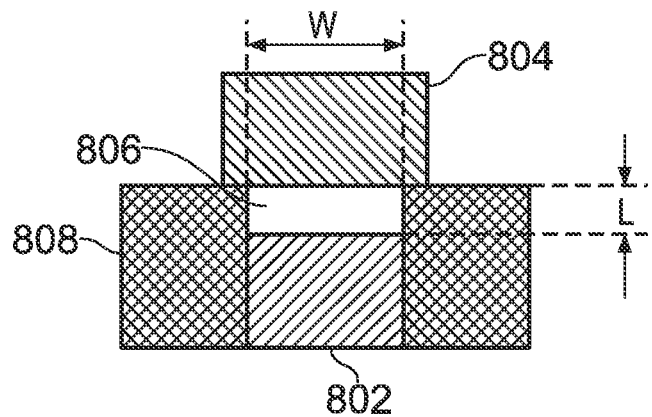
FIG. 8 provides a schematic diagram of a thin-film resistor in accordance with an example of the present disclosure.

In FIG. 8 a vertical resistor geometry is illustrated, where the terminals are in the same vertical plane and the current path is in this vertical plane. However, despite the differences in geometry compared with FIGS. 3 to 7, this geometry is still based on forming the terminals from separate layers.

In FIG. 8 the resistor is formed from the first (lower) terminal 802, the resistor body 806 and the second (upper) terminal 804, where these elements may be surrounded by a dielectric/insulator 808. In contrast to the resistor geometries illustrated in FIGS. 3 to 7, the value of the resistor of FIG. 8 is primarily determined by the thickness L of the resistive film, which may be in the order of 10 nm, thus allowing compact but high value resistors to be formed. For example, a resistor having the same width/length ratio as the previous 20 kΩ resistor (W/L=50) may be formed from a resistive film having an area of approximately 0.005 μm².

Although the resistor geometry of FIG. 8 may allow compact and/or low value resistors to be formed, the small geometries may be challenging to achieve and errors in alignment may have a greater impact on the eventual value of the resistor.

Figure 9:
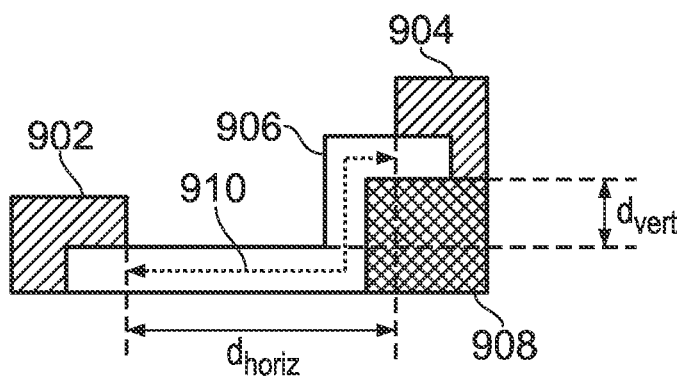
FIG. 9 provides a schematic diagram of a thin-film resistor in accordance with an example of the present disclosure.

FIG. 9 provides a further resistor geometry but where the current path between the terminals (i.e. the current path between the interfaces between the terminals and the resistor body) is both in a lateral and a vertical plane, unlike the preceding geometries where the current paths are substantially constrained to either a vertical or a lateral plane. More specifically, the current path 910 (i.e. equivalent to the separation L in FIGS. 1 to 8) is defined by both the horizontal separation $d_{horiz}$ between the terminals 902 and 904 but also their vertical separation $d_{vert}$. Furthermore, $d_{vert}$ is provided by the thickness of the insulating layer 908, thus allowing fine control of the distance $d_{vert}$ whilst possibly being easier to implement than the vertical geometry of FIG. 8. This geometry may also allow the overall resistance of the resistor to be finely controlled by using the distance $d_{horiz}$ to provide the bulk of the resistance and the distance $d_{vert}$ to provide finer tuning of the resistance, thus allowing smaller increments in resistance to be obtained than would be possible given the overlay error of the lithography tool being used. In a similar manner to the geometry of FIG. 3a, after deposition of the insulating layer 908, the resistive layer 906 may be deposited and, optionally, patterned, followed by the separate deposition/patterning and etching of the material for the first terminal 902 and the second terminal 904 in order to accurately control the distance $d_{horiz}$.

Figure 10:
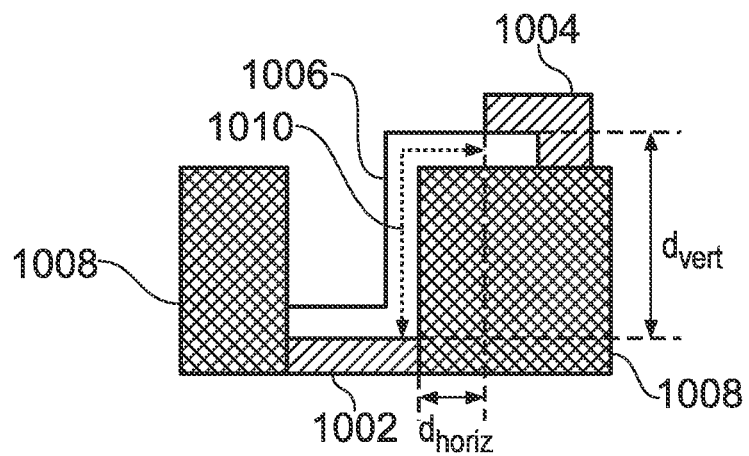
FIG. 10 provides a schematic diagram of a thin-film resistor in accordance with an example of the present disclosure.

FIG. 10 illustrates an alternative structure where the resistive film 1006 is disposed on a lower terminal 1002 but underneath the second terminal 1004 and where the distance $d_{vert}$ is still defined by the insulator 1008, and the length of the current path 1010 is defined by $d_{horiz}$ and $d_{vert}$. Due to the differences in the ordering of the terminals and resistor body, the material forming the resistor body 1006 will be deposited between the deposition of the materials forming the first and second terminals. As for the geometry of FIG. 9, if required, the distance $d_{horiz}$ may be accurately controlled via the alignment of the lithographic masks used to pattern the layers forming the first and second terminals. In a variant of the structure of FIG. 10 the second terminal 1004 may be deposited and patterned prior to deposition of resistor body 1006.

Figure 11:
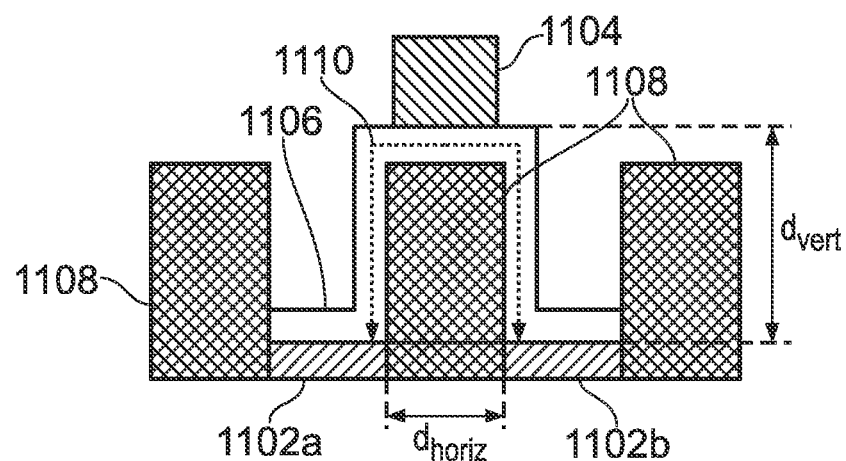
FIG. 11 provides a schematic diagram of a thin-film resistor in accordance with an example of the present disclosure.

FIG. 11 illustrates an alternative approach to the resistor geometry illustrated in FIG. 7, such that variations in the placement of the second terminal 1104 and also the height of the insulating layer 1108 have a reduced effect on the overall resistance of the resistor. In an equivalent manner to the geometry of FIG. 7, the first terminals 1102a and 1102b are electrically connected; a first resistor $R_a$ is formed from the first terminal 1102a, the resistive film 1106 and the second terminal 1104; a second resistor $R_b$ is formed from the first terminal 1102b, the resistive film 1106 and the second terminal 1104; and the total resistance between the first terminal and the second terminal is $R=R_a R_b/(R_a+R_b)$.

Figure 12:
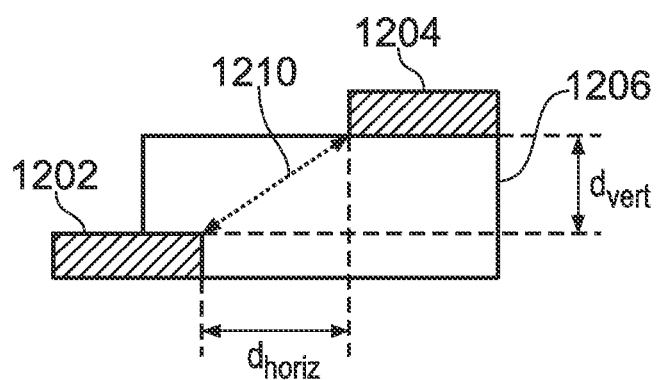
FIG. 12 provides a schematic diagram of a thin-film resistor in accordance with an example of the present disclosure.

FIG. 12 illustrates an alternative resistor geometry where the current path is defined by both the horizontal and vertical dimensions of the resistive film. Referring to FIG. 12, the current path 1210 through the resistive film 1206 is defined by the horizontal separation $d_{horiz}$ of the first terminal 1202 and the terminal 1204, and the vertical separation $d_{vert}$ of the first terminal 1202 and the second terminal 1204 defined by the thickness of the resistive film 1206.

FIGS. 13, 14, and 16 provide example processes for the fabrication of one or more of the various resistor geometries described above with reference to FIGS. 3 to 12. As set out in relation to FIGS. 3a and 3b, the structures illustrated in FIGS. 13 and 16 are idealised structures that do not illustrate the conformal nature of certain material layers that are deposited in the fabrication process, and thus the surfaces of the various layers may not only be vertical and horizontal.

FIGS. 13a to 13i illustrate the steps of an example process for fabricating a resistor with the geometry described with reference to FIG. 3.

Figure 13A:
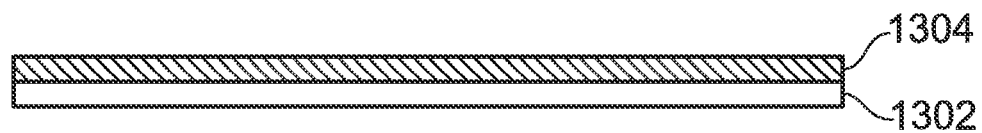
FIGS. 13a to 13i provides a schematic diagram of the stages in the fabrication of a thin-film resistor in accordance with an example of the present disclosure.

In FIG. 13a a substrate 1302 firstly has a resistive film 1304 deposited on it. The resistive film may be a material which is inherently resistive and therefore does not require any further processing to achieve the desired resistivity. Alternatively, the resistive film may initially be a semiconductor layer which requires processing to achieve a desired resistive behaviour at some point during the fabrication process. For example, a metal oxide material may be deposited using a PVD technique with or without oxygen present in the environment. Alternatively, the properties of the resistive film may be achieved by processing after the initial formation/deposition stage. For example, the initially deposited material may be selectively exposed to electromagnetic radiation so as to anneal it, and increase its electrical conductivity such that it provides a resistive, rather than semi-conductive, path. It will be appreciated that this selective exposure is just one approach and the change in properties may be achieved in a variety of ways. Further techniques suitable for use in certain embodiments, to increase the conductivity of one or more of the bodies, are described in U.S. Ser. No. 10/204,683B2. In another example, the semi-conductor that forms the resistive film is deposited on a doped surface that acts as a dopant source, such that the properties of the semi-conductor change once it has been deposited.

Figure 13B:
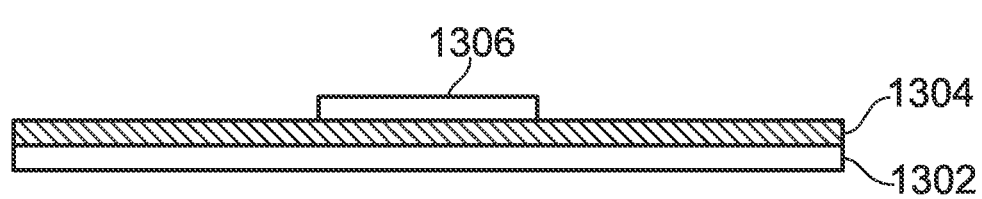

In FIG. 13b photolithography has been used to pattern a photoresist. In particular, a photoresist is applied to the resistive film 1304 and then a photomask and a light source are used to develop the photoresist to leave the patterned photoresist 1306.

Figure 13C:
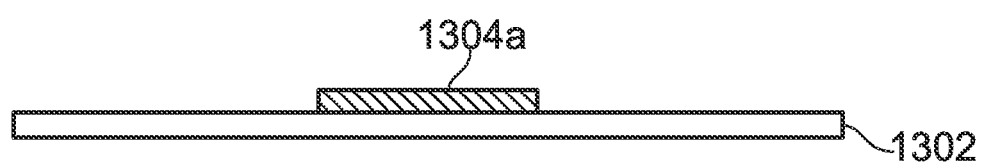

In FIG. 13c etching has been performed to remove the parts of the resistive film that were not covered by the patterned photoresist 1306 to leave the resistive body 1304a.

Although the resistive body 1304a of the desired size has been described as being achieved by etching it may also be achieved via selective deposition or other means to achieve a resistive body of the desired geometry. The etching process may be a wet etching process or a plasma etching process, however, any suitable etching process may be used.

Figure 13D:
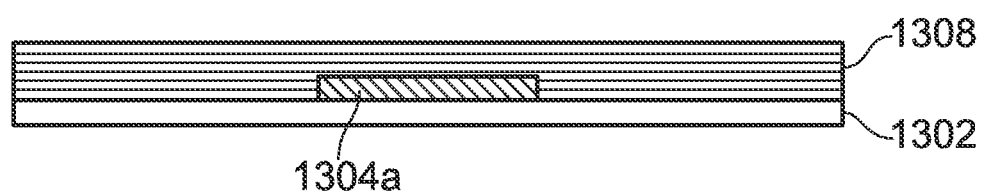

In FIG. 13d a conductive layer 1308 has been deposited to form a first terminal of the resistor.

Figure 13E:
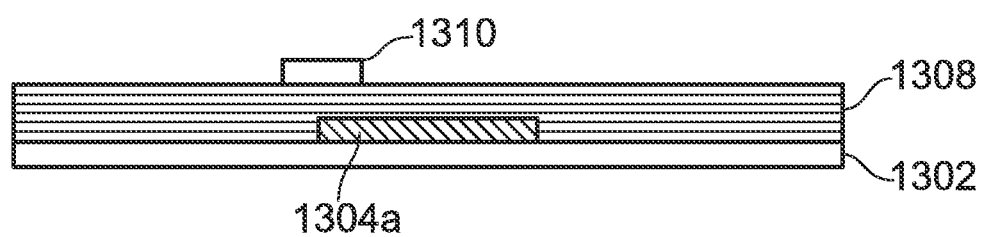

In FIG. 13e a photoresist has been applied to the conductive layer 1306 and then a photomask and a light source are used to develop the photoresist to leave the patterned photoresist 1310.

Figure 13F:
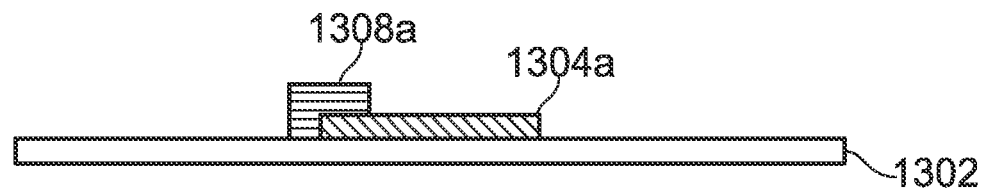

In FIG. 13f etching has been performed to remove the parts of the conductive layer 1308 that were not covered by the patterned photoresist 1310 to leave the first terminal 1308a of the resistor.

Figure 13G:
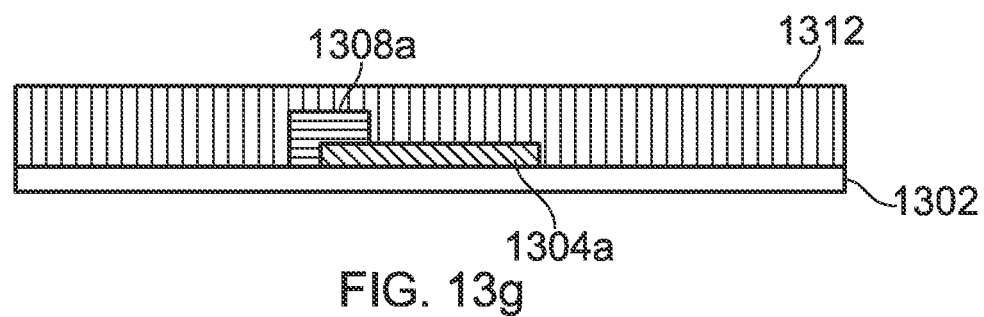

In FIG. 13g a second conductive layer 1312 has been deposited to form a second terminal of the resistor. The second conductive layer may be composed of the same material as the first conductive layer 1308. Alternatively, the second conductive layer may be composed of a different material from that of the first conductive layer 1308.

Figure 13H:
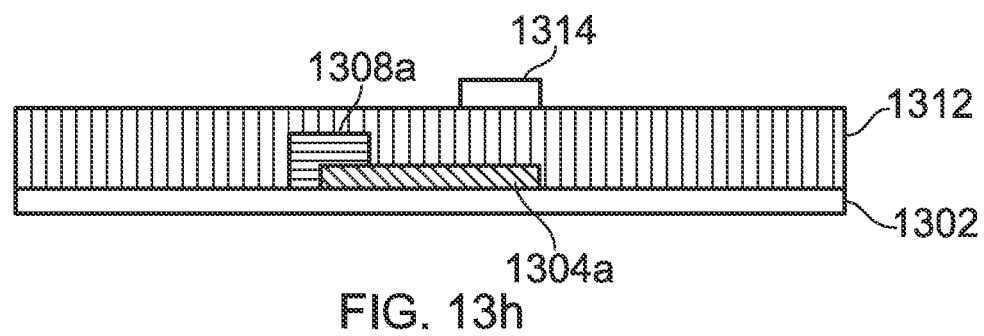

In FIG. 13h a photoresist has been applied to the conductive layer 1312 and then a photomask and a light source are used to develop the photoresist to leave the patterned photoresist 1314.

Figure 13I:
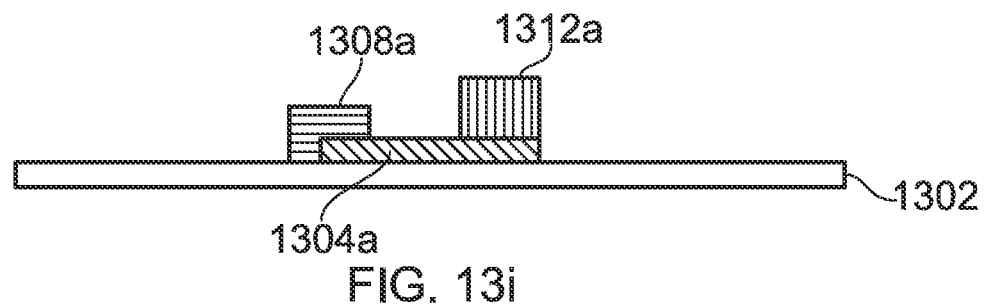

In FIG. 13i etching has been performed to remove the parts of the conductive layer 1312 that were not covered by the patterned photoresist 1314 to leave the second terminal 1312a of the resistor. This step may be facilitated by employing a different etch process from that used in the step of FIG. 13f to form the first terminal 1308a, so that the formation of the second terminal 1312a does not adversely affect the first terminal 1308a.

As illustrated in FIGS. 13d-i, the first terminal 1308a and the second terminal 1312a of the resistor are formed separately from two different layers of conductive material. Consequently, it is the alignment of the two photomasks and thus the patterned photoresists 1310 and 1314 that enable the separation of terminals to be smaller than the in-plane resolution of the lithographic process, thus allowing smaller and more varied value resistors to be formed.

Although not specified in relation to FIGS. 13a to 13i, one or more of the different layers may be configured as an etch-stop in order to simplify the fabrication process.

Figure 14A:
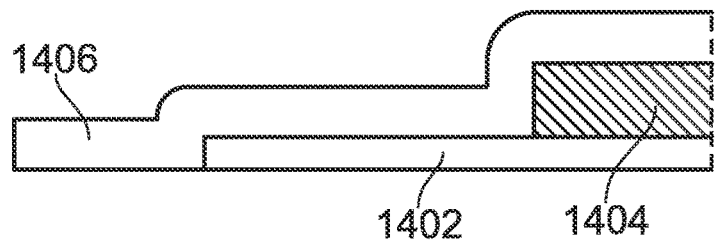
FIGS. 14a to 14d provides a schematic diagram of the stages in the fabrication of a thin-film resistor in accordance with an example of the present disclosure.

FIGS. 14a to 14d illustrate an alternative approach to the fabrication of a resistor structure equivalent to that considered in FIG. 13. In particular, an additional layer may be introduced and may simply fabrication. For example, after deposition and patterning of the resistor body 1402 and the first terminal 1404, a dielectric layer 1406 may be deposited as shown in FIG. 14a.

Figure 14B:
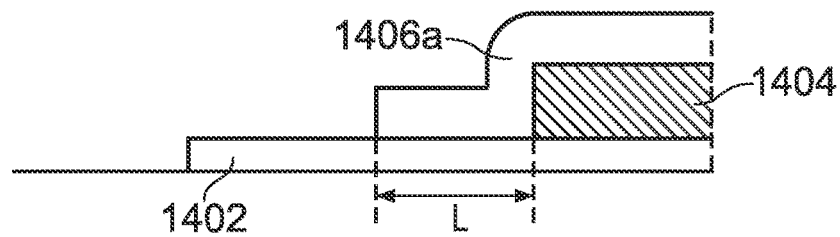

After deposition of the layer 1406, layer 1406 may be patterned and etched to form the layer 1406a that defines the separation L between the resistor terminals as shown in FIG. 14b.

Figure 14C:
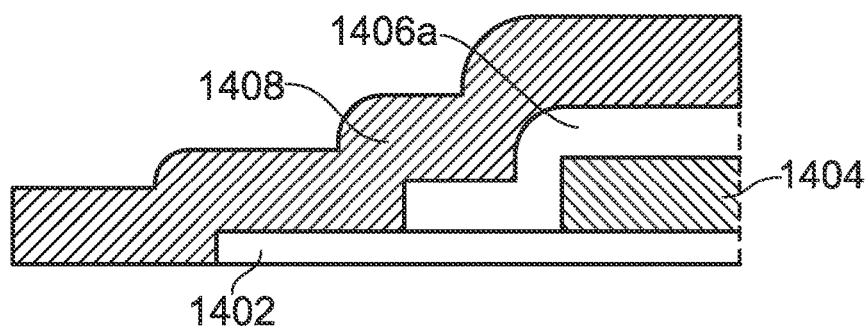

A subsequent layer of conductive material 1408 for forming a second terminal 1408a may then be deposited on the exposed resistor body 1402 and the patterned dielectric layer 1406a as shown in FIG. 14c.

Figure 14D:
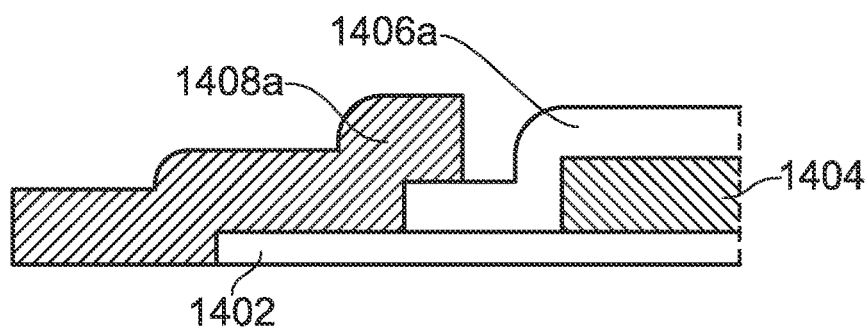

Lastly, as shown in FIG. 14d, the layer of conductive material 1408 may be patterned and etched to form the second terminal 1408a. The patterned dielectric layer 1406a provides an etch stop.

Figure 15:
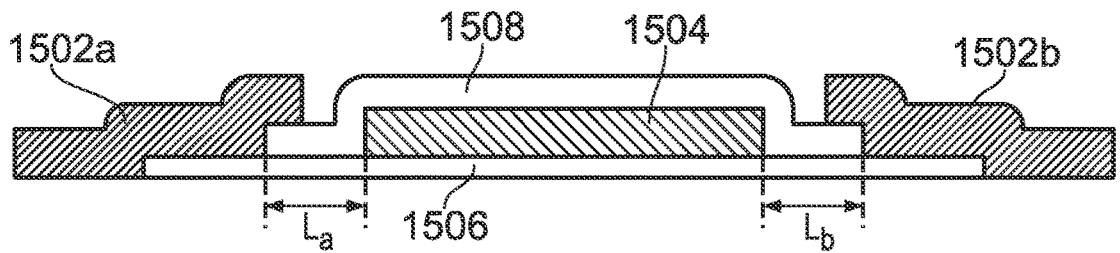
FIG. 15 provides a schematic diagram of a thin-film resistor in accordance with an example of the present disclosure, and FIGS. 16a to 16g provides a schematic diagram of the stages in the fabrication of a thin-film resistor in accordance with an example of the present disclosure.

A similar approach to that illustrated with respect to FIGS. 14a to 14d may be applied to fabricating the resistor structure illustrated in FIG. 7, thus resulting in the resistor structure illustrated in FIG. 15. More specifically, layer 1508, which may be a dielectric layer for example, is used to define the separation $L_a$ of the terminals 1502a and 1504, and the separation $L_b$ of the terminals 1504 and 1502b and thus the effective length of the two resistor bodies of the resistive layer 1506 that form a parallel resistor, which reduces the sensitivity of the resulting resistor value to variations in alignment between the layers forming the terminals of the resistor.

As for the other example resistor structures and fabrication processes, the structure and process of FIGS. 14a to 14d and 15 may enable the separation of the resistor terminals and thus the effective length of the resistor body to be less than the in-plane resolution of the lithographic tool being used since it is the overlay error of the lithographic masks that limits the minimum reproducible separation of the resistor terminals. Consequently, a separation of the terminals may be smaller than the minimum in-plane feature size of the lithography tool and thus the resistor/IC that the terminals are included in.

FIG. 16 provides another example approach to the fabrication of one or more of the resistor geometries described with reference to FIGS. 3 to 12, where the deposition order of the materials for the first terminal, resistor body and second terminal differs to that shown in FIG. 13. Furthermore, as for FIG. 13, the structures illustrated in FIG. 16 are idealised structures that do not illustrate the possible conformal nature of certain material layers that are deposited in the fabrication process, for example the conductive layer 1610 that forms the terminal 1610a.

Figure 16A:
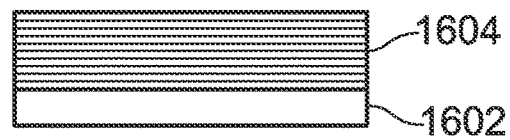

In FIG. 16a, a conductive layer 1604 for forming a first terminal has been deposited on the substrate or other supporting structure 1602.

Figure 16B:
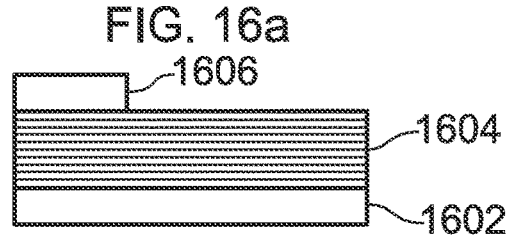

In FIG. 16b a photoresist has been applied to the conductive layer 1604 and then a photomask and a light source are used to develop the photoresist to leave the patterned photoresist 1606.

Figure 16C:
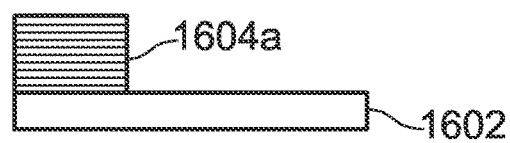

In FIG. 16c etching has been performed to remove the parts of the conductive layer 1604 that were not covered by the patterned photoresist 1606 to leave the first terminal 1604a of the resistor.

Figure 16D:
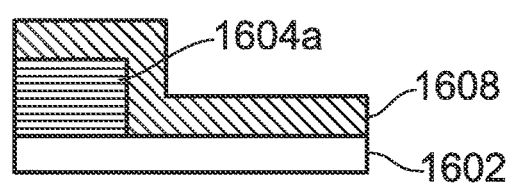

In FIG. 16d a resistive film 1608 is deposited on the first terminal 1604a and the substrate 1602 to form the body of the resistor. The resistive film may have the required properties without further processing or may require further processing to achieve the required resistive properties as described above.

Figure 16E:
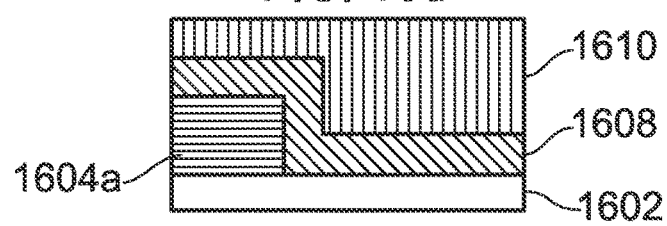

In FIG. 16e a second conductive layer 1610 is deposited for forming a second terminal of the resistor.

Figure 16F:
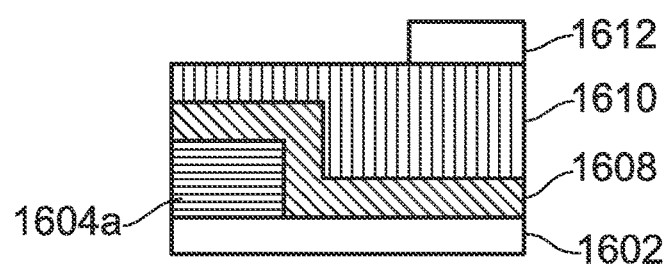

In FIG. 16f a photoresist has been applied to the conductive layer 1610 and then a photomask and a light source are used to develop the photoresist to leave the patterned photoresist 1612.

Figure 16G:
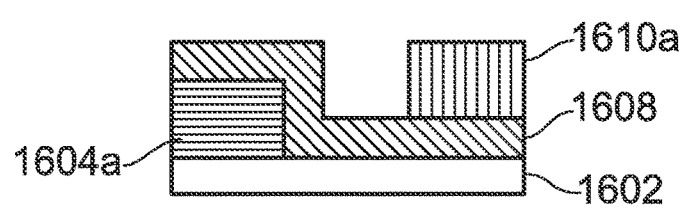

In FIG. 16g etching has been performed to remove the parts of the conductive layer 1610 that were not covered by the patterned photoresist 1612 to leave the second terminal 1610a of the resistor.

The ordering and resulting geometry of FIG. 16 may have certain advantages over that of FIG. 13. For example, in FIG. 16 only the resistive film layer 1408 may be required to be an etch stop since it covers the first terminal 1604a and thus the first terminal 1604a will not be exposed during etching.

Although FIGS. 13, 14, and 16 have been described with respect to optical lithography, any suitable lithography may be used and/or any combination of lithography and etching techniques. For example, it will be appreciated that a wide variety of techniques may be used to perform the patterning, such as techniques involving one or more of the following lithography, photolithography, imprinting, nano-imprinting.

The deposition of the various layers in FIGS. 13, 14 and 16 those used to form any of the geometries illustrated in FIGS. 3 to 12 and 15 may be performed using a technique selected from a list comprising: vapour deposition (physical e.g. sputter; chemical e.g. PECVD); vacuum deposition (e.g. thermal or e-beam evaporation); coating (spin, dip, blade, bar, spray, slot die); printing (jet, gravure, offset, screen, flexo); pulsed-laser deposition (PLD); atomic layer deposition (ALD) coating.

Furthermore, FIGS. 13, 14, and 16 are intended to illustrate the order of the steps of the fabrication process and are not to scale, such that the shape of the layers, photoresist terminals etc. may vary depending on the techniques used for deposition, etching, lithograph etc.

In FIGS. 3 to 16 each conductive layer may be a metal such as Au, Ti, Al, Mo, Pt, Pd, Ag, Cu, Ni, Cr, Ta, W; a metal alloy such as MoNi, MoCr, AlSi; a transparent conductive oxide (such as ITO, IZO, AZO); a metal nitride such as TiN; a carbon material such as carbon black, carbon nanotubes, graphene; a conducting polymer such as polyaniline, PEDOT:PSS; or a semiconductor material.

If a semiconductor is used to form the resistive film, the semiconductor material may be selected from a list comprising: compound semiconductors (such as GaAs, GaN, InP, CdSe, InGaAs, InGaAsSb), metal oxides such as ZnO, SnO2, NiO, SnO, Cu2O, In2O3, LiZnO, ZnSnO, InSnO (ITO), InZnO (IZO), HfInZnO (HIZO), InGaZnO (IGZO); metal oxynitrides, e.g. ZnxOyNz; inorganic semiconductors (such as amorphous, microcrystalline or nanocrystalline Si); organic semiconductors (such as CuPc, pentacene, PTCDA, methylene blue, Orange G, rubrene); polymer semiconductors (such as PEDOT:PSS, POT, P3OT, P3HT, polyaniline, polycarbazole); 2D materials (such as graphene); chalcogenides such as MoS2, GeSbTe; and perovskites (SrTiO3, CH3NH3PbCl3, H2NCHNH2PbCl3, CsSnI3). Alternatively, the resistive film may be formed from a non-semiconducting metal-oxide.

It will also be appreciated that although the various resistor geometries have been described in isolation, the resistors may be formed along with one or more components on a substrate. For example, a resistor may be fabricated along with a transistor as set out GB 1912025.2, where the resistor may act as a load for the transistor. Alternatively, numerous resistors may be formed simultaneously using the described fabrications techniques.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method for fabricating a thin-film resistor on a supporting structure, the thin-film resistor comprising a first terminal, a second terminal, and a resistor body providing a resistive current path between the first terminal and the second terminal, the method comprising:
   depositing a first layer of conductive material onto at least one of the supporting structure and the resistor body, applying a first lithographic process to the first layer, and etching the first layer to form the first terminal; and
   depositing a second layer of conductive material onto at least one of the supporting structure and the resistor body, applying a second lithographic process to the second layer, and etching the second layer to form the second terminal,
   wherein the first lithographic process is different to the second lithographic process, and a lateral separation of the first terminal and the second terminal is less than an in-plane minimum feature size of the first and second lithographic processes,
   wherein the lateral separation of the first terminal and the second terminal is non-zero, and
   wherein the second terminal and the resistor body are formed from separate thin-film layers of material.

2. The method of claim 1, wherein the lithographic processes are optical lithographic processes.

3. The method of claim 1, wherein at least a portion of the second terminal lies outside of a lateral planar region having a height and position defined by the vertical extent of the first terminal.

4. The method of claim 1, wherein the resistor body is non-planar.

5. The method of claim 1, wherein the resistor body includes a first planar region lying in a first lateral plane and a second planar region lying in a second lateral plane, and a third planar region lying in a third plane substantially perpendicular to the first and second lateral planes and connecting the first and second planar regions, and wherein the first and second lateral planes are separated by a distance in a direction parallel to the third plane.

6. The method of claim 5, wherein the first planar region of the resistor body laterally overlaps at least part of the first terminal.

7. The method of claim 5, wherein the second planar region of the resistor body laterally overlaps at least part of the second terminal.

8. The method of claim 1, wherein the resistor comprises a third terminal electrically connected to the first terminal, and wherein the resistor body provides a resistive path between the second terminal and the third terminal which is different to the resistive path between the first terminal and the second terminal, and wherein the method comprises forming the third terminal at a separate time to at least one of the first terminal and the second terminal.

9. The method of claim 8, wherein the separation of the second terminal and the third terminal is less than an in-plane minimum feature size of the first and second lithographic processes.

10. The method of claim 8, wherein the third terminal lies at least partially outside of a lateral planar region having a height and position defined by a vertical extent of the first terminal and a lateral planar region having a height and position defined by a vertical extent of the second terminal.

11. The method of claim 1, wherein applying the first and second lithographic processes each includes depositing an unstated photoresist layer onto a respective layer of conductive material, applying a photo-lithographic mask to the photoresist layer, and developing the photoresist layer to produce a patterned photoresist layer.

* * * * *